US012660703B2

(12) United States Patent
Prasad et al.

(10) Patent No.:  US 12,660,703 B2
(45) Date of Patent:       Jun. 16, 2026

(54) 3D LAYOUT AND ORGANIZATION FOR ENHANCEMENT OF MODERN MEMORY SYSTEMS

(71) Applicant: Advanced Micro Devices, Inc., Santa Clara, CA (US)

(72) Inventors: Divya Madapusi Srinivas Prasad, Mountain View, CA (US); Vignesh Adhinarayanan, Austin, TX (US); Michael Ignatowski, Austin, TX (US); Hyung-Dong Lee, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 74 days.

(21) Appl. No.: 18/215,681

(22) Filed:   Jun. 28, 2023

(65)            Prior Publication Data
      US 2024/0088099 A1      Mar. 14, 2024

Related U.S. Application Data

(60) Provisional application No. 63/405,339, filed on Sep. 9, 2022.

(51) Int. Cl.
      H10W 90/00        (2026.01)
      G11C 11/4097      (2006.01)
      H10W 90/20        (2026.01)
(52) U.S. Cl.
      CPC ......... H10W 90/00 (2026.01); G11C 11/4097 (2013.01); H10W 90/20 (2026.01)
(58) Field of Classification Search
      USPC ........................................ 365/51
      See application file for complete search history.

(56)            References Cited

U.S. PATENT DOCUMENTS

| | | | | |
|---|---|---|---|---|
| 6,043,562 | A | 3/2000 | Keeth | |
| 6,741,104 | B2 | 5/2004 | Forbes et al. | |
| 8,947,931 | B1* | 2/2015 | D'Abreu | H01L 25/0652 |
| | | | | 365/185.11 |
| 9,450,023 | B1* | 9/2016 | Konevecki | H10N 70/8265 |
| 11,152,056 | B1* | 10/2021 | Seo | G11C 11/2273 |
| 11,251,155 | B2* | 2/2022 | Lee | H01L 25/0657 |
| 2008/0054489 | A1* | 3/2008 | Farrar | H01L 24/73 |
| | | | | 257/E21.705 |
| 2013/0229846 | A1* | 9/2013 | Chien | H10N 70/823 |
| | | | | 365/51 |
| 2015/0063039 | A1* | 3/2015 | Chen | G11C 29/04 |
| | | | | 365/189.02 |
| 2015/0325290 | A1* | 11/2015 | Lasser | G11C 13/0002 |
| | | | | 365/148 |

(Continued)

OTHER PUBLICATIONS

International Search Report and Written Opinion for PCT/US2023/029046 dated Oct. 19, 2023.

*Primary Examiner* — Amir Zarabian
(74) *Attorney, Agent, or Firm* — Patterson + Sheridan, LLP

(57)            ABSTRACT

Memory stacks having substantially vertical bitlines, and chip packages having the same, are disclosed herein. In one example, a memory stack is provided that includes a first memory IC die and a second memory IC die. The second memory IC die is stacked on the first memory IC die. Bitlines are routed through the first and second IC dies in a substantially vertical orientation. Wordlines within the first memory IC die are oriented orthogonal to the bitlines.

19 Claims, 11 Drawing Sheets

(56) References Cited

U.S. PATENT DOCUMENTS

| | | | |
|---|---|---|---|
| 2017/0160955 A1 | 6/2017 | Jayasena et al. | |
| 2018/0024948 A1* | 1/2018 | Tsai | G11C 7/1039 |
| | | | 710/310 |
| 2020/0185370 A1* | 6/2020 | Juengling | G11C 11/4091 |
| 2022/0223196 A1* | 7/2022 | He | G11C 11/4094 |
| 2023/0195314 A1* | 6/2023 | Yoshihara | G11C 16/08 |
| | | | 711/154 |
| 2023/0284459 A1* | 9/2023 | Yoo | H10N 70/823 |
| | | | 257/4 |
| 2023/0326530 A1* | 10/2023 | Chen | G11C 11/5628 |
| | | | 365/185.03 |
| 2023/0376234 A1* | 11/2023 | DeLaCruz | G06F 3/0679 |
| 2024/0008259 A1* | 1/2024 | Sharma | H10B 12/36 |
| 2024/0078195 A1* | 3/2024 | Madan | G06F 13/1636 |
| 2024/0404598 A1* | 12/2024 | Hsu | G06N 3/065 |
| 2024/0411709 A1 | 12/2024 | Dally et al. | |

* cited by examiner

3D LAYOUT AND ORGANIZATION FOR ENHANCEMENT OF MODERN MEMORY SYSTEMS

CROSS-REFERENCE TO RELATED APPLICATIONS

This application claims benefit of U.S. Provisional Patent Application Ser. No. 63/405,339, filed Sep. 9, 2022, which is incorporated by reference in its entirety.

TECHNICAL FIELD

Embodiments of the invention generally relate to stacked memory dies having SRAM, DRAM and/or non-volatile memories (NVM) like FeRAM that share vertical bitlines, and chip packages containing the same.

BACKGROUND

The memory wall (i.e., bandwidth limitations) has been referred to as one of the key limiters in pushing the bounds of computation in modern systems. High bandwidth memory (HBM) and other stacked dynamic random-access memory (DRAM) memories have been proposed/enabled to alleviate off-chip memory access latency as well as increase memory density. However, while these advances have taken place, in the stacked memory block, each memory tier has largely been treated as an independent macro for memory organization, circuit and technology design. To truly unlock the potential of stacked memories, e.g., DRAM/HBM, the memory subsystem needs to be optimized for optimal 3D layout and stacking for superior qualities for the overall system.

FIG. 1 depicts a chip package 100 having a memory cube (e.g., memory stack) 104 connected to a compute/processor (e.g., logic) die 102 through substrate 112, such as a silicon interposer and/or package substrate. The memory cube 104 may optionally include a memory controller (logic/memory interface) die 106 disposed between the memory cube 104 and the substrate 112. The memory cube 104 comprises a plurality of stacked memory dies 108. The stacked memory dies 108 may be mechanically and electrically connected via a solder and/or hybrid bonding interface. In the example depicted in FIG. 1, the stacked memory dies 108 connected to one another via a hybrid bonding interface, while the memory controller die 106 is coupled to the substrate 112 via a solder connections 116.

Functional circuitry (i.e., memory cells/bitcells) 124 of the memory dies 108 are connected to the functional circuitry 126 of the memory controller die 106. The functional circuitry 126 of the memory controller die 106 is also coupled to functional circuitry (i.e., processor/logic circuitry) 122 of the logic die 102 via routing 120 form in the substrate 112. The functional circuitry 122 of the logic die 102 is also connected to circuitry of a printed circuit board 114 via solder balls 116.

The memory cells 124 are typically DRAM. DRAMs have been the most popular off-chip memory; however, even Double Data Rate 5 Synchronous DRAM (DDR5) has certain Performance-Power-Area (PPA) limitations of having to go off-chip to access data (e.g., this can be in the order of 100 ns). The typical DRAM bitcell consists of a one transistor and one capacitor (1T-1C) structure, where the capacitor is formed by a linear dielectric layer sandwiched in between conductor plates. System Instructions-Per-Cycle (IPC) is often limited by DRAM bandwidth and latency, especially in memory-heavy workloads. HBM has been introduced to provide increased bandwidth and memory density, allowing up to 8-12 layers (e.g., tiers) of DRAM IC dies 124 to be stacked on top of each other with an optional logic/memory interface die 106. This memory stack 104 can either be connected to the CPU/GPU through silicon interposers (or package substrate 112 as shown in FIG. 1) or placed on top of the CPU/GPU themselves to provide superior connectivity and performance. Industry has been striving to optimize the performance, power, and memory density/area of the memory block.

An NVM, such as ferroelectric random-access memory (FeRAM), is like 1T-1C DRAM, except for that the capacitor is made of a ferroelectric material versus a (linear) dielectric as used in traditional DRAM. Bit '0' and '1' are written with electric polarization orientations of the ferroelectric material in the capacitor. The benefit of this technology is refresh-free storage which has potential to offer more density and performance over DRAM. There are some manifestations where destructive read can be avoided but other challenges such as endurance exist.

Magneto resistive random-access memory (MRAM) on the other hand has a one transistor and one resistor (1T-1R) bitcell. Unlike DRAM and FeRAM, MRAM does not have a destructive read. However, MRAM is less reliable compared to FeRAM and has lower endurance and retention.

SUMMARY

Memory stacks having substantially vertical bitlines (bitlines going across tiers, vertically, with within tier wordlines for example), and chip packages having the same, are disclosed herein. In one example, a memory stack is provided that includes a first memory IC die and a second memory IC die. The second memory IC die is stacked on the first memory IC die. Bitlines are routed through the first and second IC dies in a substantially vertical orientation. Wordlines within the first memory IC die are oriented orthogonal relative to the bitlines.

In another example, bitlines within a memory stack are skewed relative to the wordlines disposed in the memory IC dies of the memory stack.

In another example, a memory stack having substantially vertical bitlines may include a different types of memory dies. The memory IC die may be dynamic random-access memory (DRAM) circuitry, ferro-electric random-access memory (FeRAM) circuitry or other type of memory circuitry.

In another example, a memory stack having substantially vertical bitlines may include a controller die stacked below and in contact with a first memory IC die of the memory stack.

In another example, a memory stack having substantially vertical bitlines may include a first memory IC die that optionally includes ferro-electric random-access memory (FeRAM) circuitry. The first memory IC die may further include optional controller circuitry that communicates with memory circuitry of the first memory IC die. The first memory IC die may still further include optional processor circuitry that communicates with the memory circuitry of the first memory IC die through the controller circuitry.

In another example, a memory stack has segmented wordlines that are skewed relative to bitlines.

In another example, a memory stack has a buffer IC die disposed between a first memory IC die and a second memory IC die of the memory stack.

In another example, a memory stack has a third memory IC die stacked on a second memory IC die, the second memory IC die stacked on a first memory IC die. Optionally, error correction code (EEC) support circuitry may be disposed in at least two of the first, second and third memory IC dies.

In yet another example, a chip package is provided that includes a memory stack mounted on a substrate. The memory stack of the chip package includes a first memory IC die and a second memory IC die. The second memory IC die is stacked on the first memory IC die. Bitlines are routed through the first and second IC dies in a substantially vertical orientation. Wordlines within the first memory IC die are oriented orthogonal to the bitlines.

In another example of a chip package, bitlines within a memory stack are skewed relative to the wordlines disposed in the memory IC dies of the memory stack.

DETAILED DESCRIPTION

Advanced memory technology roadmap targets increased memory density and bandwidth, with minimal impact to power and performance to alleviate the memory-bottleneck to system performance. The technology disclosed herein addresses these challenges with advancements in memory technology, memory stacking and novel memories like FeRAMs, updating circuitry, architecture and memory interfacing principles. Advantageous enhancements specific to HBM/other forms of stacked DRAM and/or FeRAM are disclosed herein.

Described below are several 3D organizations for stacked memory that are advantageous for power, latency, access bandwidth, reduced rowhammer vulnerability, and allow increased memory density per tier (i.e., per memory die). The technology described herein provides a true 3D technology and architecture cooptimization for modern memory subsystems, going beyond simply stacking to achieve true potential of stacked memory technology. The technology disclosed herein is enabled through the use of bitlines that space multiple memory dies of the memory cube/stack.

Non-volatile main memories such as ferro-electric random-access memory (FeRAM), magneto resistive random-access memory (MRAM), and volatile memories such as DRAMs (including HBM and other stacked variants of DRAM) are being considered and traded-off for achieving higher memory density, performance, and lower power. The technology described herein includes a variety of defining methods, systems and devices to design compute- and application-aware advanced memory-based systems. In some examples, stacked DRAM and/or FeRAM based advanced memories are leveraged to provide performance improvements over conventional HBM memory stacks.

Some of the advantages that may be realized with the disclosed multi-tier bitline technology include enhancing electronic systems with advanced memories by (i) intelligent and advanced memory refresh and thermal-aware computation and address allocation, (ii) advanced memory controller design, and (iii) low-power, high performance, and memory density enhancing techniques by employing novel technology and circuit design techniques.

Figure 1:
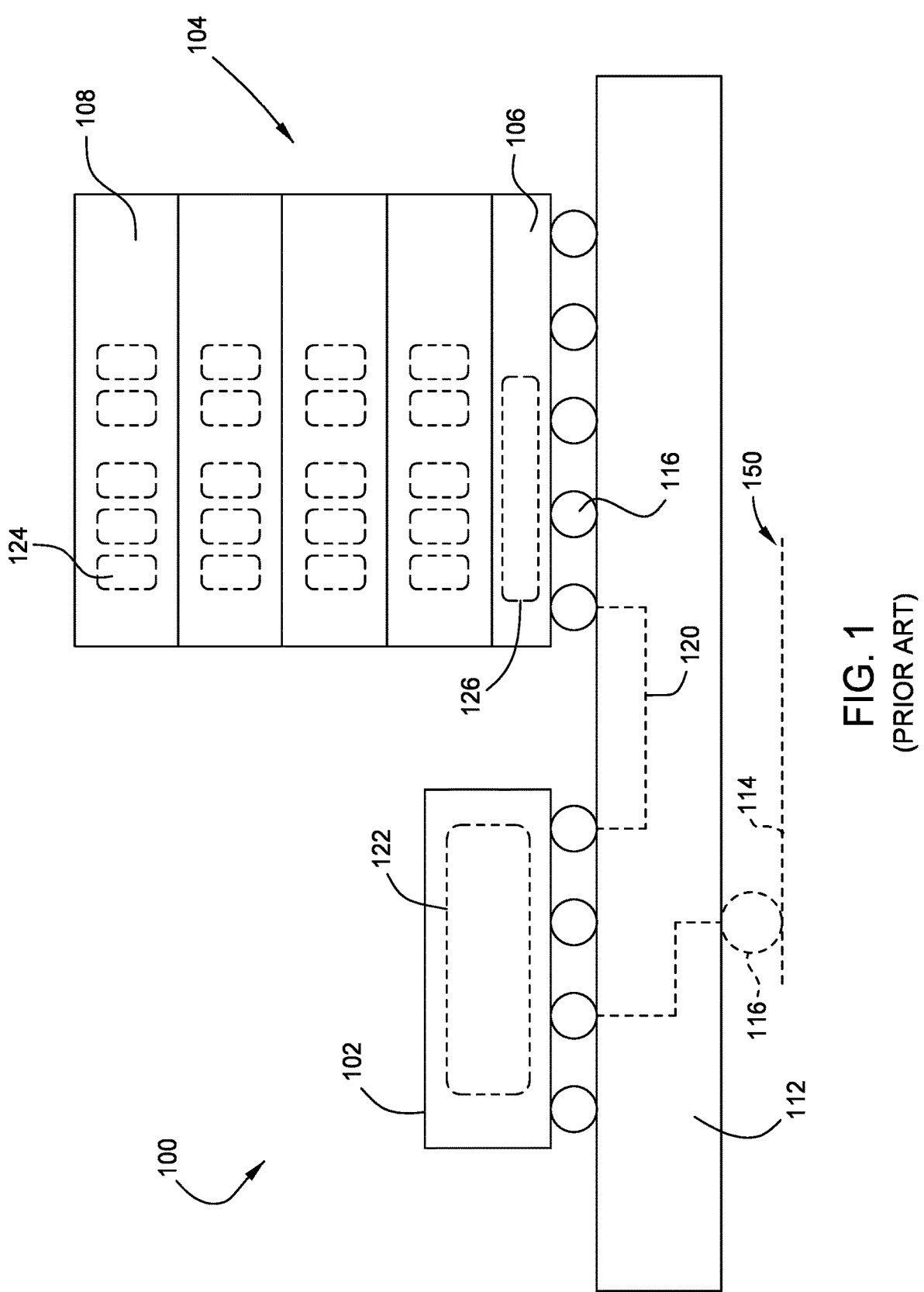
FIG. 1 depicts a chip package having a memory stack connected to a compute/processor die through a silicon interposer or package substrate.

Any of the memory stacks described herein that have bitlines that span multiple tiers of memory dies may be utilized in in place of the memory stack 104 of the chip package 100 depicted in FIG. 1, or other suitable memory device. The chip package 100 depicted in FIG. 1, which may include any of the other memory stacks described below, may be coupled to a printed circuit board (PCB) 112 to form an electronic device 150, such as but not limited to the graphics card depicted in FIG. 1.

Figure 2:
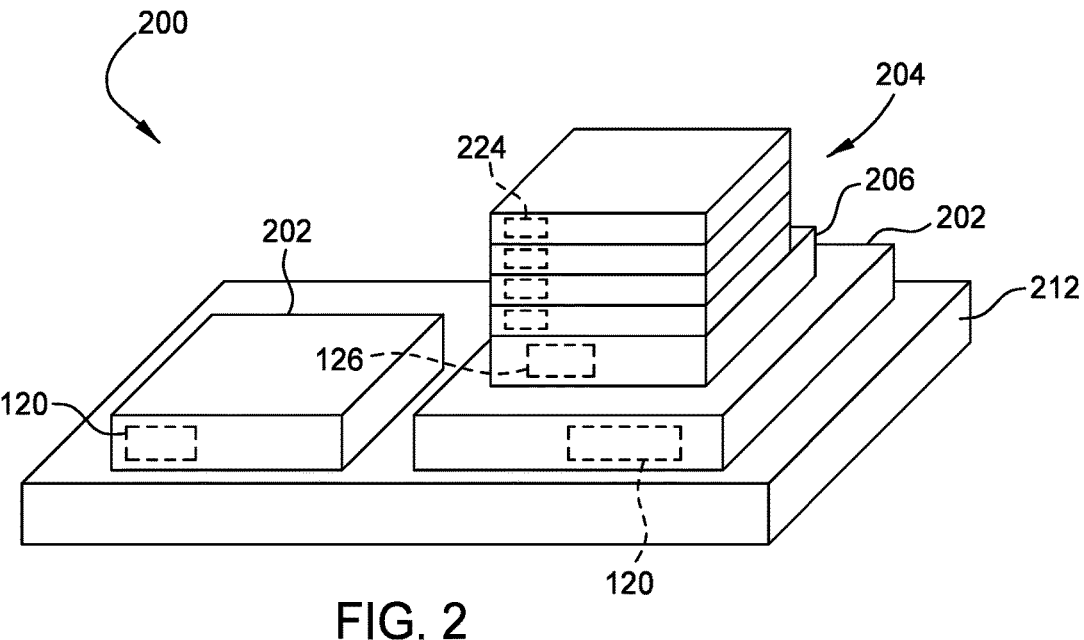
FIG. 2 depicts a chip package having a memory IC die stack disposed on top of a compute/processor chip and a memory-interface/controller die.

FIG. 2 depicts a chip package 200 having a memory IC die stack 204 disposed on top of a compute/processor chip (e.g., logic IC die) 202 and a memory-interface/controller die 206. In one example, the chip package 200 that is part of an electronic system. The memory IC die stack 204 is coupled to a substrate 212, such as an interposer or package substrate. Optionally, the logic IC die 202 may be disposed next to the memory IC die stack 204, similar to the chip package 100 of FIG. 1.

Continuing to refer to FIG. 2, the memory IC die stack 204 includes a plurality of memory dies 208. Each stacked memory die 208 may also be referred to as a tier or layer of the memory IC die stack 204. The memory dies 208 may include volatile or non-volatile memory circuitry 224. In the example illustrated in FIG. 2, the memory dies 208 may include DRAM circuitry 224, with the DRAM/HBM cube 204 stacked on top of the compute integrated circuitry (IC) die 202 with a memory-interface IC die 206. The compute IC die (e.g., compute or logic die/chip) 202 may be a CPU, GPU, FPGA, or other accelerator. The DRAM/HBM cube 204 includes a plurality of DRAM IC dies 208 that are vertically stacked. Each DRAM IC die 208 includes DRAM circuitry 224. The stacked DRAM IC dies 208 may be connected by solder connections, hybrid bonding or other suitable connection. Although 4 DRAM IC dies 208 are illustrated in the DRAM/HBM cube 202 depicted in FIG. 2, the DRAM/HBM cube 202 may alternatively have more or less than 4 DRAM IC dies 208.

Figures 3A, 3B:
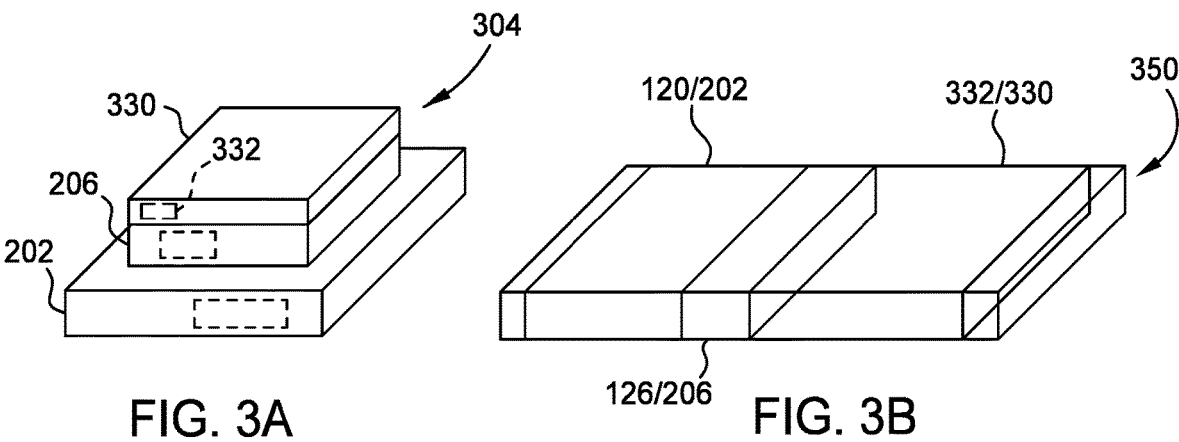
FIG. 3A depicts a FeRAM die stacked on top of a compute/processor chip and a memory-interface/controller die.
FIG. 3B depicts a FeRAM, a compute/processor circuitry and memory-interface/controller circuitry integrated into a single integrated circuit (IC) die.

FIG. 3A depicts another example of a memory stack 304 that includes a FeRAM IC die 330 stacked on top of a compute/processor IC die 202 and a memory-interface/controller IC die 206. The FeRAM IC die 330 includes FeRAM circuitry 332. In the example depicted in FIG. 3A, the FeRAM IC die 330 is vertically stacked on top of the memory-interface/controller IC die 206, while the memory-interface/controller IC die 206 is vertically stacked on top of the compute/processor IC die 202. The interconnections between the dies may be made by solder connections, hybrid bonding or other suitable connection. Although not shown in FIG. 3A, additional memory dies (such as memory dies 208 illustrated in FIG. 2) may be stacked on the FeRAM IC die 330 shown in FIG. 3A, such as in the manner illustrated in FIG. 2 to form another configuration of the chip package 200.

FIG. 3B depicts another example of a memory device that includes FeRAM circuitry 332, a compute/processor circuitry 120 and memory-interface/controller circuitry 120 integrated into a single integrated circuit (IC) die 350. The circuitries 332, 120, 126 allow the single IC die 350 to function as combined memory, logic and memory controller IC dies 430, 120, 126. Although not shown in FIG. 3B, additional memory dies (such as memory dies 208 illustrated in FIG. 2) may be stacked on the FeRAM IC die 330/memory circuitry 332 portion of the single IC die 350 shown in FIG. 3B, such as in the manner illustrated in FIG. 2 to form another configuration of the chip package 200. The additional memory dies 108 stacked on the on the IC die 350 shown in FIG. 3B may be one or more FeRAM dies 330, and/or one or more DRAM IC dies 108, and/or one or more other type of memory dies.

Figures 4A, 4B:
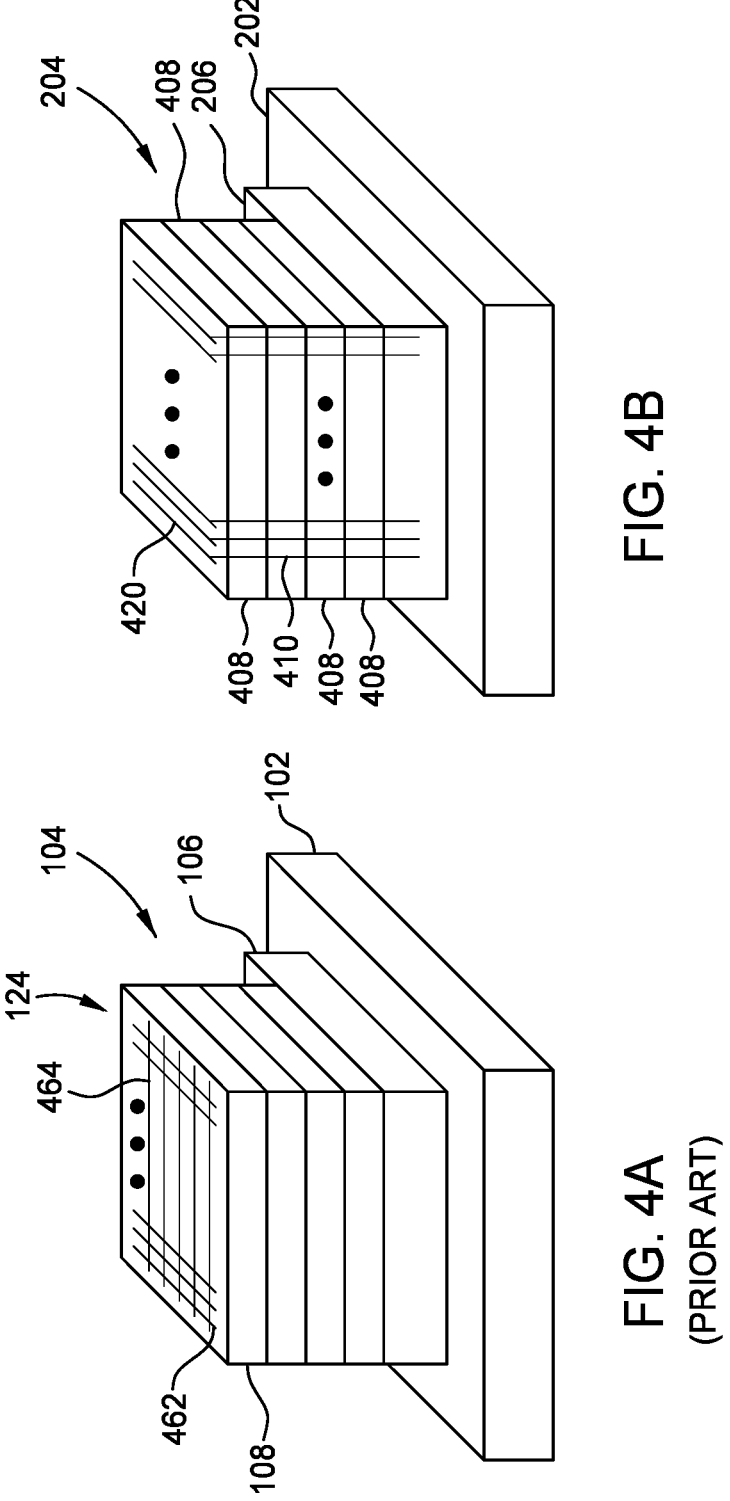
FIG. 4A is a memory IC die stack disposed on top of a compute/processor chip and a memory-interface/controller die, each memory IC die having a conventional arrangement of wordlines and bitlines.
FIG. 4B is a memory IC die stack disposed on top of a compute/processor chip and a memory-interface/controller die, each memory IC die sharing a vertical arrangement of bitlines.

FIG. 4A is a DRAM IC die stack 104 disposed on top of a compute/processor chip 102 and a memory-interface/controller die 106, each DRAM IC die 108 of the die stack 104 having a conventional arrangement of wordlines 462 and bitlines 464. The wordlines 462 generally reside in a plane that is parallel to a plane in which the bitlines 464 reside, both planes being in a common one of the memory dies 108. The DRAM IC die stack 102 is generally similar to the DRAM IC die cube (e.g., stack) depicted in FIG. 1. Although 4 DRAM IC die are illustrated in the DRAM IC die stack depicted in FIG. 4A, the DRAM IC die stack may alternatively have more or less than 4 DRAM IC dies. In FIG. 4A, the bitlines and wordlines are oriented orthogonal to each other within each DRAM IC die.

FIG. 4B is a memory IC die stack 204 disposed on top of a compute/processor chip 202 and a memory-interface/controller die 206, each memory IC die 208 sharing a substantially vertical arrangement of bitlines 410. The memory IC dies 208 of the die stack 204 may include volatile or non-volatile functional circuitry 224. In one example, the memory IC dies 208 of the die stack 204 include DRAM functional circuitry 224. The memory IC die stack 204 is generally similar to the DRAM IC die cube (e.g., stack) 204 depicted in FIG. 2, such that the memory IC dies includes DRAM. Although 4 DRAM IC die 208 are illustrated in the DRAM IC die stack 204 depicted in FIG. 4B, the DRAM IC die stack 208 may alternatively have more or less than 4 DRAM IC dies, or include other types of memory, such as illustrated in FIGS. 3A and 3B, among other types of memory.

In FIG. 4B, the bitlines 410 disposed in a substantially vertical, cross-tier (i.e., inter-die) arrangement, with the wordlines 420 oriented orthogonal to the bitlines within each memory IC die 208. Each bitline 410 and each wordline 420 are associated with a corresponding bitcell (e.g., memory cell more clearly illustrated in FIG. 4C). In FIG. 4B, the bitlines 410 are substantially oriented in a direction in which the memory IC dies 208 are stacked one on the other. The direction in which the memory IC dies 208 are stacked one on the other is generally defined as a vertical direction, and thus the bitlines 410 are oriented in a substantially vertical direction. "Substantially" is intended herein to mean that 75 percent or more of a length a bitline 410 is routed in a particular direction or orientation. For example, 75 percent or more of a bitline 410 is routed in the vertical direction or orientation. In another example, 75 percent or more of a bitline 410 is routed in the direction in which the memory IC dies 208 are stacked one on the other. In yet another example, the bitlines 410 are skewed to the wordlines 420 within each memory IC die 208. In the example depicted in FIG. 4A, the bitlines 410 are oriented orthogonally and skewed relative to the wordlines 420 within at least one of the DRAM IC dies of the memory stack 404.

In the example depicted in FIG. 4B, the memory stack 404 is configured to write words vertically, across dies 408. One of the key limiters for DRAM scaling is rowhammering due to neighboring cells. The arrangement of FIG. 4B reduces coupling to neighboring cells by breaking down wordlines 420 into smaller segments, across tiers, thus reducing the number of victim bitcells through segmentation of the wordlines 420, exposing fewer aggressor bitcells to the neighboring victim bitcells. In some examples, portions of a bitline residing in different memory ICs are collinear.

Figure 4C:
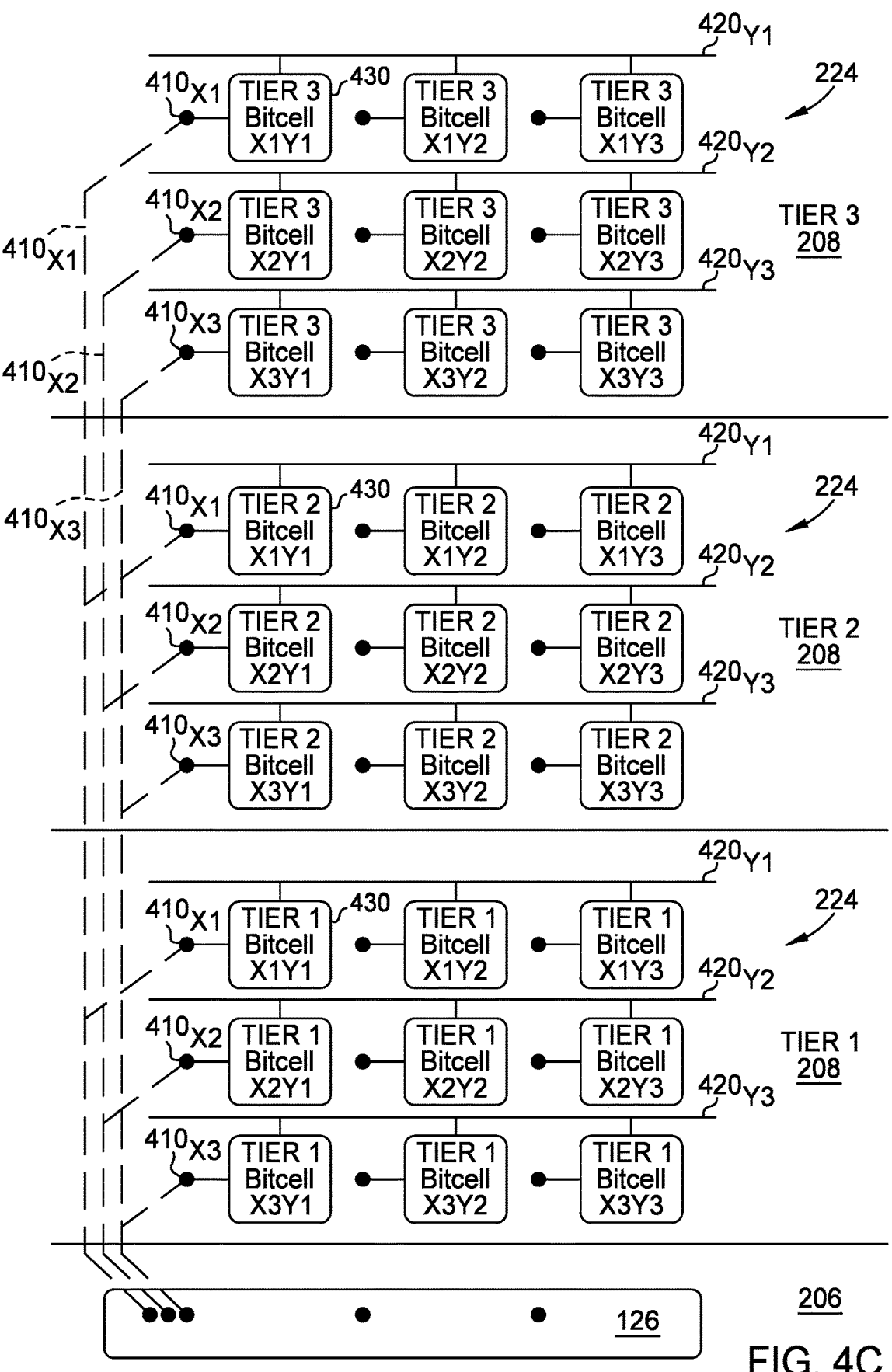
FIG. 4C is a schematic diagram of a portion of the memory IC die stack disposed on top of the memory-interface/controller die, each memory IC die sharing a vertical arrangement of bitlines.

FIG. 4C is a schematic diagram of a portion of the memory IC die stack 404 illustrated in FIG. 4B disposed on top of the memory-interface/controller die 406, each memory IC die 408 sharing a vertical arrangement of bitlines 410. In FIG. 4C, the top (e.g., fourth) tier memory IC die 408 shown in FIG. 4B is omitted.

In the schematic diagram of FIG. 4C, the functional circuitry 226 of each memory IC die 208 is arranged in an array of bitcells (e.g., memory cells) 430. The bitcells 430 may be arranged in an X/Y array, with the wordlines 420 extending in the plane of the memory IC die 408 in the Y direction. Although the bitcells 430 are shown in a 3×3 array for ease of discussion, the actually number of bitcells 430 is much larger. In FIG. 4C, each wordlines 420 is identified with a subscript $Y1$, $Y2$, $Y3$ to signify which row of the array the wordline 420 resides. Drivers and select circuitry, not shown, for the wordlines 420 may reside in the memory IC die 408 or the controller IC 206.

The bitlines 410 are arranged vertically (e.g., the Z direction) through each of the tiers of memory IC dies 408. For example, bitline $410_{X1}$ is routed vertically through each of the tier of memory IC dies 408 and interfaces with the bitcell $430_{X1Y1}$ of the array of billcells 430 of each tier of memory IC dies 408. The bitline $410_{X1}$ may extend through vias formed in each of the memory IC dies 408. Similarly, bitline $410_{X2}$ is routed vertically through the tiers of memory IC dies 408 and interfaces with the bitcell $430_{X2Y1}$ in each respective tier of memory IC dies 408. Again, bitline $410_{X3}$ is routed vertically through the tiers of memory IC dies 408 and interfaces with the bitcell $430_{X3Y1}$ in each respective tier of memory IC dies 408. Thus, when a particular wordline 420 on a specific tier is driven by the controller functional circuitry 126, data in the bitcell 430 associated with the associated bitcell 430 can be read or written via the associated bitline 410. The bitlines 410 are coupled to sense amplifiers, not shown, that reside in the functional circuitry 126 of the memory controller IC die 406.

Figure 5A:
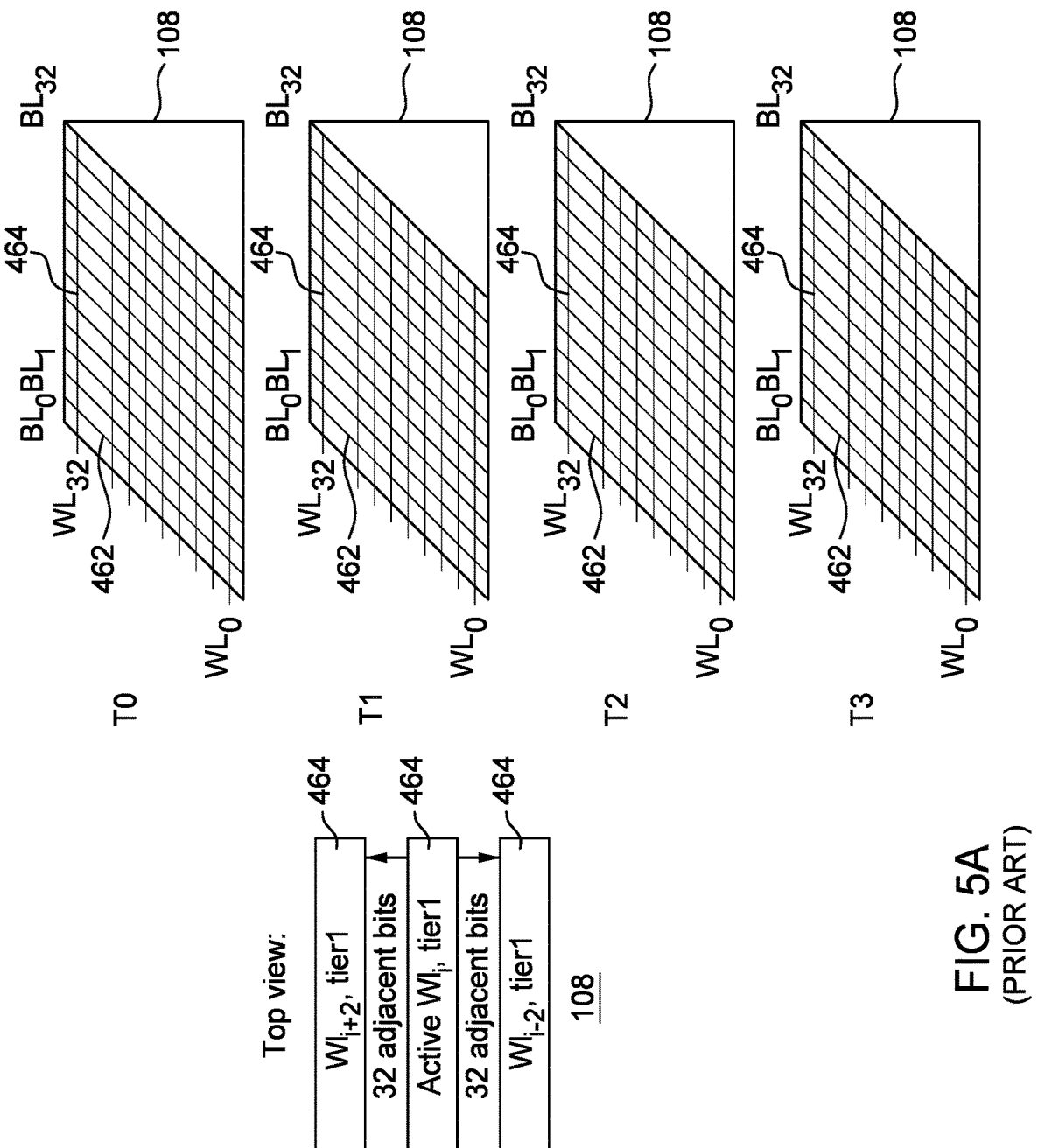
FIG. 5A includes a schematic exploded view of the DRAM IC dies of the DRAM IC die stack of FIG. 4A illustrating the conventional arrangement of wordlines and bitlines, along with a schematic top view of a portion of one of the DRAM IC dies.
Figure 5B:
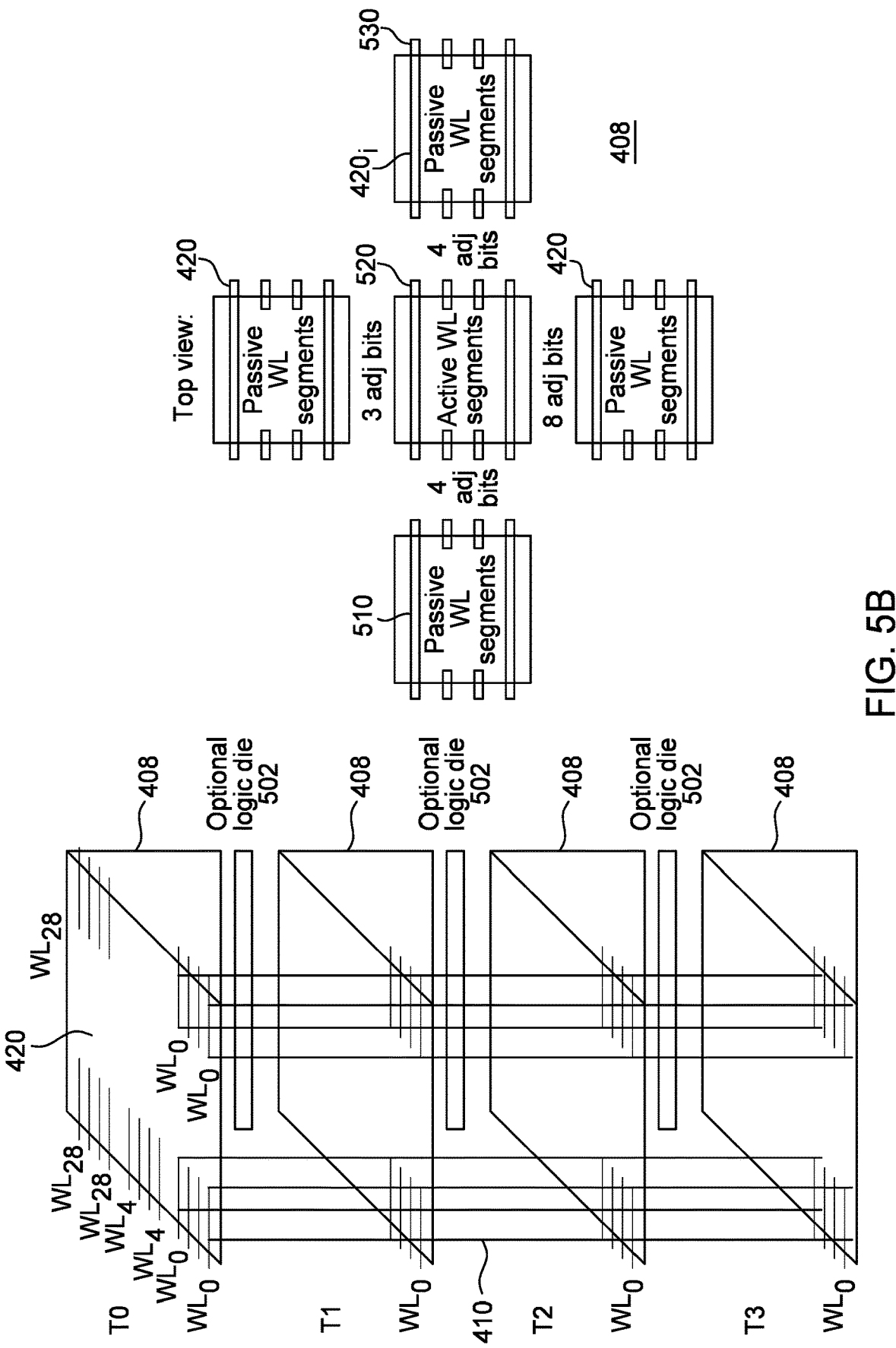
FIG. 5B includes a schematic exploded view of the memory IC dies of the DRAM IC die stack of FIG. 4B illustrating the vertical arrangement of bitlines, along with a schematic top view of a portion of one of the memory IC dies.

FIGS. 5A and 5B compare exemplary DRAM IC die stacks 104, 204 of FIG. 4A and FIG. 4B to illustrate the reduction of rowhammering potential. FIG. 5A is a schematic exploded view of the DRAM IC dies 108 of the DRAM IC die stack 104 of FIG. 4A illustrating the conventional arrangement of wordlines 464 and bitlines 462. The DRAM IC die stack 104 illustrates conventional arrangements of a classical DRAM stack where both wordlines 464 and bitlines 462 reside orthogonally in the plane of the DRAM IC die 108. The schematic top view of a portion of one of the memory IC dies 108 illustrated in FIG. 5A shows the number of adjacent bits to an active wordline 464 on a single tier (i.e., in a single memory IC die 108). Total adjacent bits in this example are 256 bits that are vulnerable to rowhammering.

In contrast, the memory cube 204 in the example depicted in FIG. 5B has a substantially vertical bitline 410 arrangement. The bitline 410 may also be skewed relative to the wordlines 420. The schematic top view of a portion of one of the memory IC dies 408 illustrated in FIG. 5B shows the number of adjacent bits to an active wordline 420 on a single tier, which is dramatically less than that of the example depicted in FIG. 5A. For example, the total adjacent bits in the example of FIG. 5B that are vulnerable to rowhammering are 64 bits while 256 bits are vulnerable in example of FIG. 5A. Thus, the 64 bits that are vulnerable in example of FIG. 5B compared to the 256 bits that are vulnerable in example of FIG. 5A illustrates the substantially reduced vulnerability to rowhammering of the memory cube 204 of FIG. 5B.

Also illustrated in the schematic top view of the memory IC die 408 illustrated in FIG. 5B, the wordlines 420 are segmented (illustratively shown as co-linear segments 510, 520, 530) such that they do not run across the entire width of the DRAM IC die. Advantageously, the ISO-wordline segment groupings can be placed closer to each other, allowing for higher memory density. The close wordline 420 packing is enabled by closely pitching the vertical bitlines 410.

As multiple adjacent active rows of wordlines 420 will not affect each other, only the outer rows will affect the victim cells as illustrated in FIG. 5B. Reduced rowhammer vulnerability allows for improved intra-tier memory density, and further advances DRAM density scaling. Additionally, more "even" access times are provided since the bits are across tiers, versus as in the classical case illustrated in FIG. 5A where accessing data from tier 0, to could be faster than tier 3, t3. Additionally, with improved low-resistance connectivity (e.g., hybrid bonding or TSVs) between memory tiers, the bitline resistance can be improved, thus improving access time in DRAM/HBM. Reducing bitline resistance substantially improves access time in DRAM dies, especially in advanced technology nodes.

Sparse data access in some applications could be worse for rowhammer vulnerability, compared to block-data access, since there are more exposed victim lines with sparse accesses. Hence, rowhammer mitigation techniques as describe above are particularly beneficial, either through physical rearrangement or advanced refresh techniques.

For sparse data, e.g., 8B/16B atom sizes can be grouped in a 2D DRAM tiers, and the smaller atoms out of the larger 64B words can be connected vertically though the vertical bitline 410. Here the 3D single-bitline connectivity between tier beneficially enables the ability to tune atom sizes by modifying timing and reducing energy based on whether the request is a sparse access or not. For example, if only the first 8B is required, it can reside on t0 on the stack illustrated in FIG. 4B, and the timing of the DRAM access can be modified to not access the remaining atoms out of the 64B. This beneficially saves timing and energy, particularly when the controller IC die is configured to detect and/or determine sparse and non-sparse accesses.

In other examples, one or more buffer IC dies 502 maybe optionally disposed between two or more of the memory IC dies 408 comprising the memory stack 204 to improve the performance of the memory cube. For example, buffer IC dies 502, labeled as logic dies in FIG. 5B, may be disposed between one or more of the memory IC dies 408 (labeled as dies T0, T1, T2, T3 in FIG. 5B). Additionally, since the vertical bitline 410 could be resistive due to the packaging technology, the sense amplifiers can be distributed across dies, and localized per die (or on a corresponding buffer IC die) to allow sensing smaller voltage gradients on the bitlines 410. This way, only the amplified voltage gradient will need to traverse vertically through the resistive bitline 410.

Figures 6A, 6B:
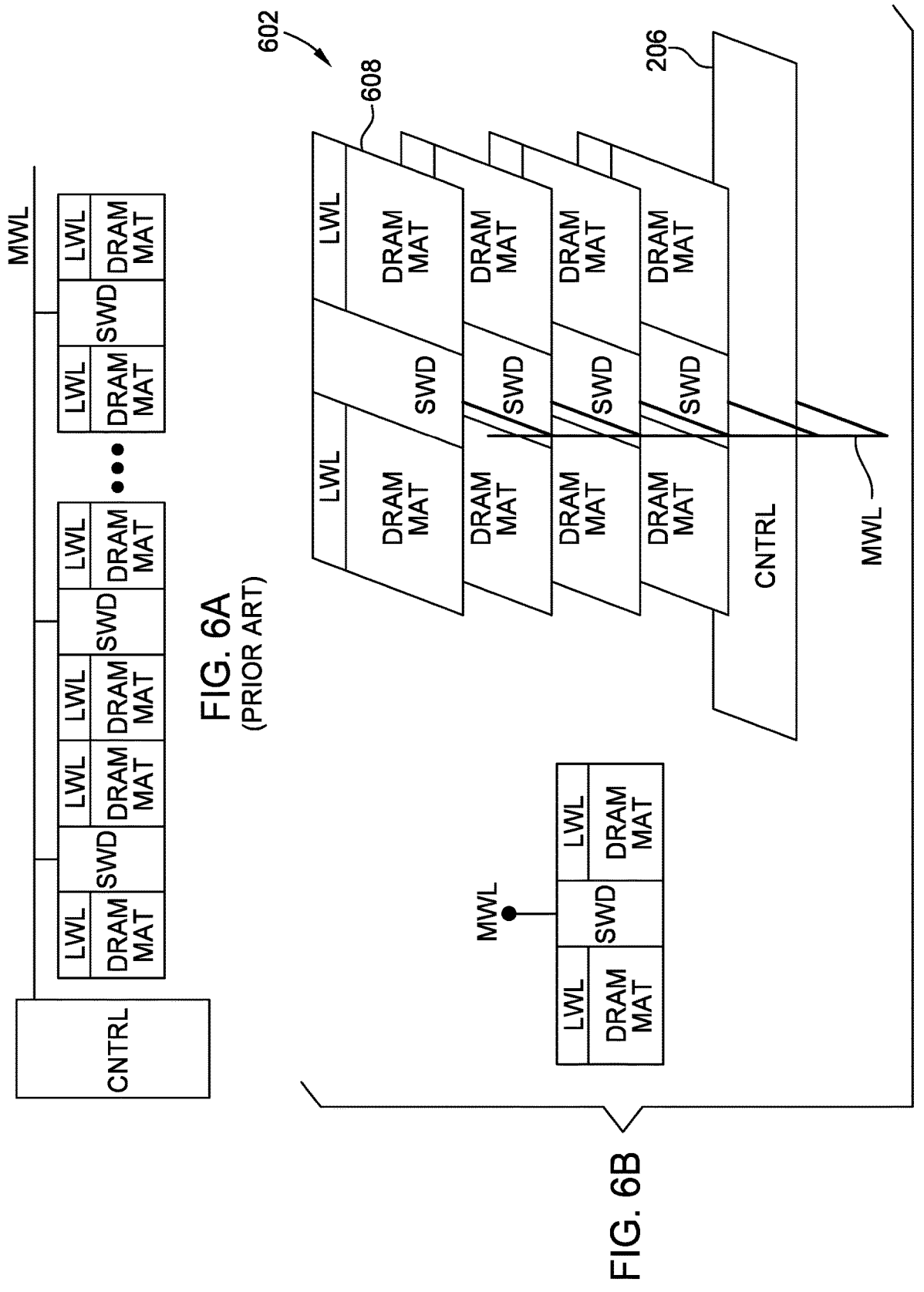
FIG. 6A is a schematic diagram of a conventional DRAM sub-array organized in a 2D plane.
FIG. 6B is a schematic diagram of a memory sub-array organized in a 3D plane.

To reduce overheads associated with latency of issuing certain commands, the master wordline or the control bus could be routed vertically in certain 3D organizations. A comparison is illustrated in the examples shown in FIGS. 6A and 6B that compare a traditional memory bank's sub-array and a 3D subarray structure. FIG. 6A is a schematic diagram of a conventional DRAM sub-array organized in a 2D plane in a single memory die, while FIG. 6B is a schematic diagram of a memory sub-array organized in a 3D plane across multiple memory dies. The latency to issue an activate command is reduced by routing the master wordline (MWL) vertically. The memory row is also organized vertically.

The MWL is coupled to a sub wordline driver (SWD) that resides in each DRAM IC die 608 of the memory stack 602 illustrated in FIG. 6B. The SWD residing in each DRAM IC die 608 is coupled by local wordlines (LWL) that reside in DRAM IC die 608 and are routed in an orientation parallel to the substrate to the plane of the top surface of the IC die 608 (i.e., in the X/Y plane) and perpendicular to the direction of the MWL (i.e., the vertical (Z) direction)). The LWL connect the SWD to the DRAM mat (e.g., array of memory cells). Thus, each MWL is connected to DRAM mats in multiple IC dies 608.

In the 3D subarray structure illustrated in FIG. 6B, small rows (e.g., 128B) are activated by activating some dies only in the vertical row organization. Small atom reads/writes result in data read from some DRAM IC dies only which is indicated along with the read/write command.

Figure 7:
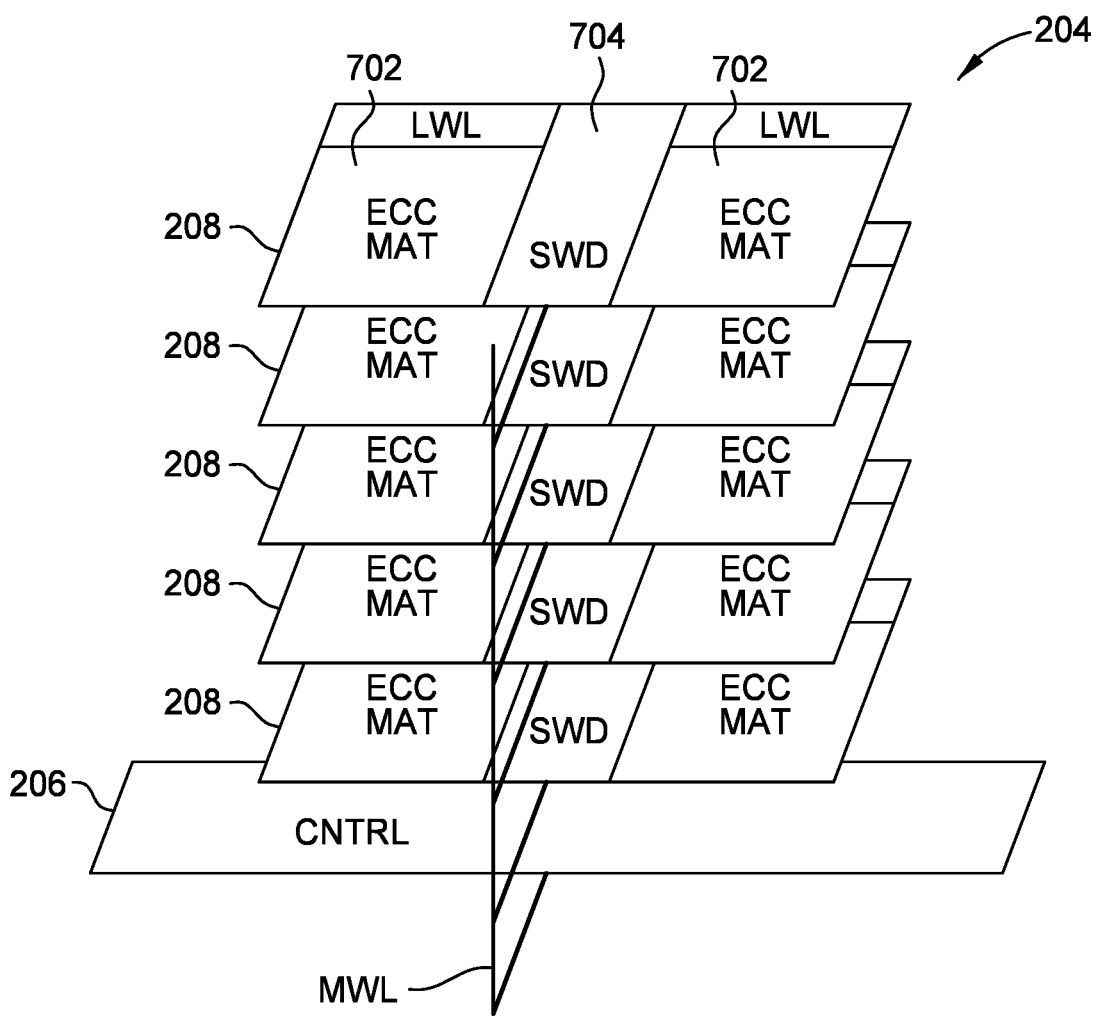
FIG. 7 is a schematic diagram of a memory sub-array organized in a 3D plane having error correction code (EEC) support distributed in different dies of a memory stack organized in a 3D plane.

FIG. 7 is a schematic diagram of a DRAM sub-array organized in a 3D plane having error correction code (EEC) support circuitry 702 distributed in different dies 208 of a memory stack 204 organized in a 3D plane. In the DRAM sub-array of FIG. 7, the sub-array organization has one or more dies having ECC support circuitry 702. Activating a vertical row also activates the row containing the corresponding ECC bits in a different die so that the check bits are protected against die faults. The overhead associated with reading a check bit is avoided by automatically activating, reading, and writing the corresponding check bits in a different die with the same command. This technique can be augmented with additional ECC support circuitry, where a first tier of ECC bits co-located with the data in the 2D plane and additional check bits are placed in one or more ECC support circuitry containing dies, depending on the level of ECC support.

The ECC support circuitry 702 in the 3D subarray organization of FIG. 7 involves placing some of the check bits in memory mats (e.g., memory cell arrays) disposed in different dies. The ECC mats in different memory dies may be activated, read, or written in parallel with the data mats via the same command. Placing the ECC mats in different dies protect the check bits from a fault that affects the data bits. The memory mats containing the ECC support circuitry 702 may optionally be separated by sub wordline driver (SWD) 704.

Figure 8A:
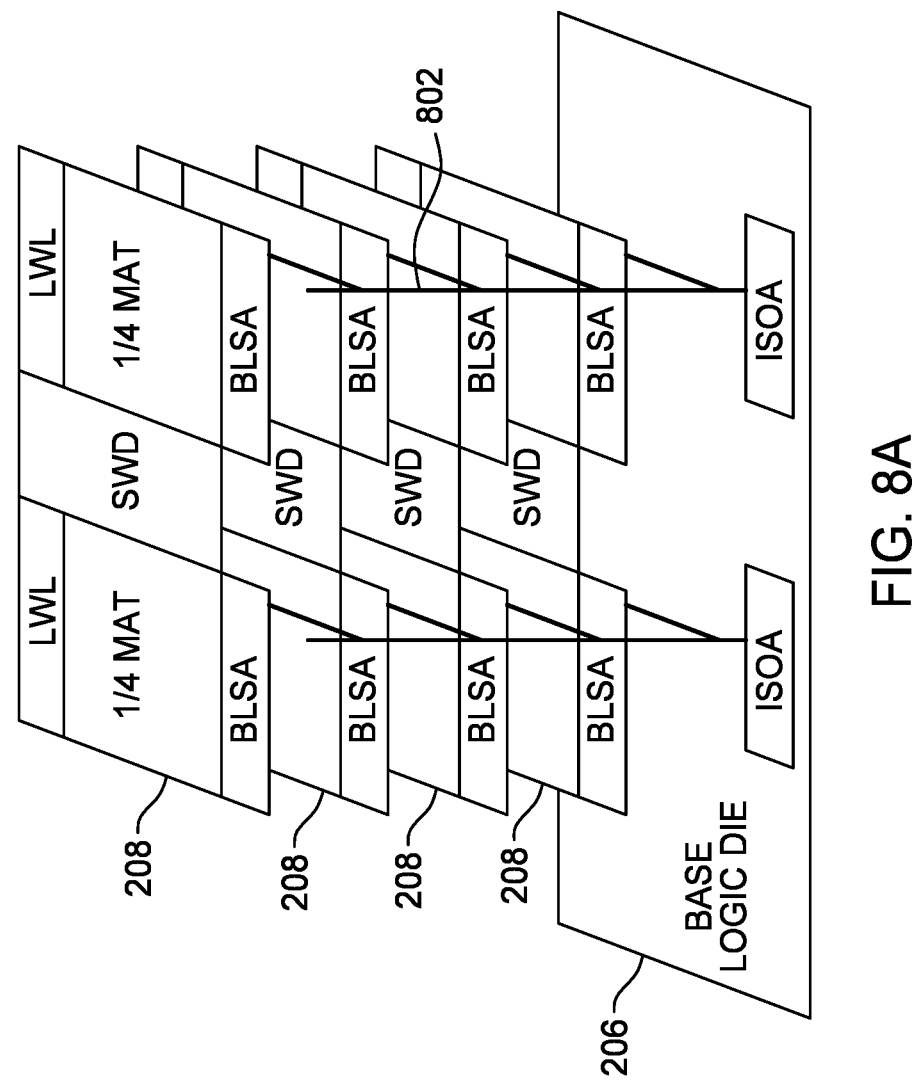
FIG. 8A is a schematic diagram of 3D memory mat organization illustrating reduced row height that enable lower timing parameters such as row cycle time.

FIG. 8A is a schematic diagram of 3D memory mat organization illustrating reduced row height that enable lower timing parameters such as row cycle time. In the 3D DRAM organization illustrated in FIG. 8A, a DRAM mat spans multiple DRAM IC dies 208 and are interconnected by data lines 802. The data lines 802 are routed vertically instead of bitlines or command lines. Optionally, both the data lines 802 and bitlines (410 such as shown in FIGS. 4B-4C and 5B, for example) or command lines may be routed vertically. The advantage of DRAM mat spanning multiple DRAM IC dies is a reduction in latency of data movement between the bitline sense amps (residing in the controller die 206) and the memory cells (i.e., lower activation and precharge latency and lower refresh latency). In the 3D MAT organization illustrated in FIG. 8A, data lines (e.g., local data lines (LDL) and master data lines (MDL)) 802 are routed vertically across DRAM IC dies 208. The vertical routing of the data lines 802 beneficially enables higher DRAM bandwidth.

The 3D mat organization of illustrated in FIG. 8A also reduces the height of each row. The lower row height beneficially enables lower timing parameters, such as row cycle time.

Figure 8B:
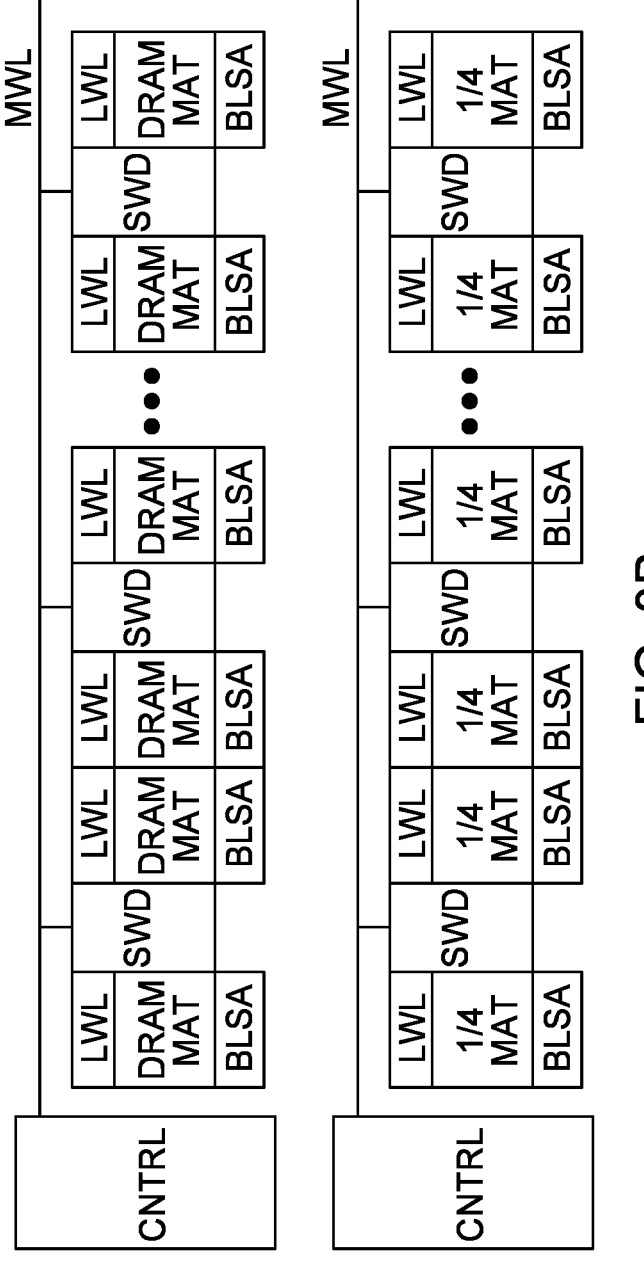
FIG. 8B is a schematic diagram illustrating sub-array structure for 3D memory mat organization.

FIG. 8B is a schematic diagram illustrating sub-array structure for 3D memory mat organization. In FIG. 8B, the MWL is routed vertically across multiple memory IC dies. Each MWL is routed to a control circuitry residing in a separate controller IC die (CNTRL).

Figure 8C:
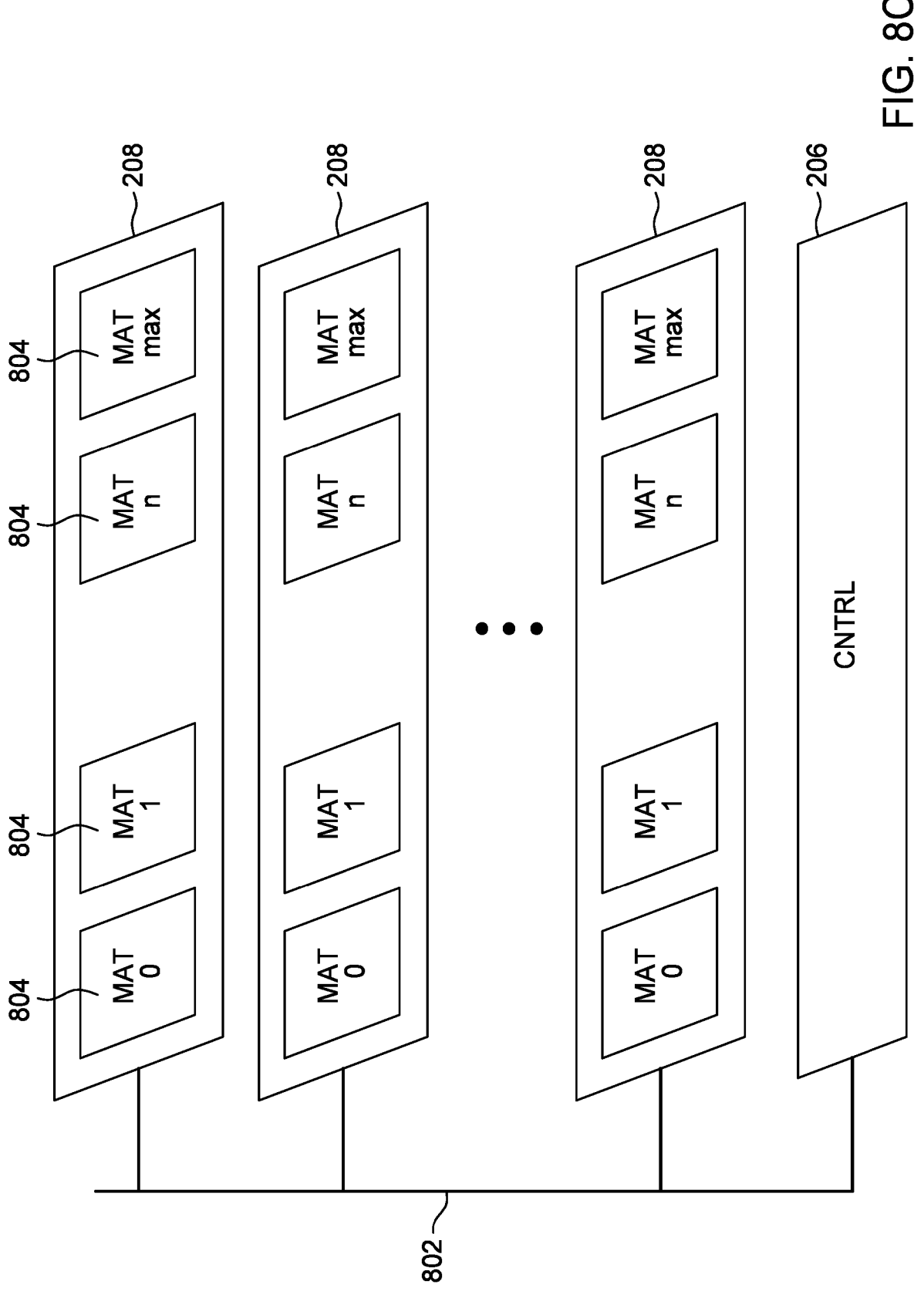
FIG. 8C is a schematic diagram illustrating another 3D memory organization, where a bank spans multiple memory IC dies with the sub-array structure and the memory mat structure remaining in the 2D plane.

FIG. 8C is a schematic diagram illustrating another 3D DRAM organization, where a bank spans multiple DRAM IC dies 208 with the sub-array structure and the DRAM memory mat structure 804 remaining in the 2D plane. In the example of FIG. 8C, a memory bank spans multiple DRAM IC dies. The sub-array structure and the DRAM MAT structure remains in the 2D plane. Each sub-array can be activated independently via a command controller in a base logic die 206, which provides a less intrusive mechanism to maximize intra-bank and activate parallelism.

Thus, disclosed above are memory stacks that include bitlines that span multiple tiers of memory dies, and chip packages having the same. The multi-tier bitlines enable electronic systems with advanced memories to have (i) intelligent and advanced memory refresh and thermal-aware computation and address allocation, (ii) advanced memory controller design, and (iii) low-power, high performance, and memory density enhancing techniques by employing novel technology and circuit design techniques. Thus, speed and processing performance is enhanced without sacrificing reliability or compactness.

While the foregoing is directed to embodiments of the present invention, other and further embodiments of the invention may be devised without departing from the basic scope thereof, and the scope thereof is determined by the claims that follow.

What is claimed is:

1. A memory stack comprising:
a first memory IC die;
a second memory IC die stacked on the first memory IC die, wherein bitlines are routed through the first and second memory IC dies in a substantially vertical orientation, and wherein wordlines within the first memory IC die are oriented orthogonal to the bitlines;
a master wordline coupled to at least one memory cell in each of the first memory IC die and the second memory IC die;
a controller die stacked and in contact with one of the first memory IC die and the second memory IC die; and
a processor die stacked in contact with the controller die, the processor die includes processor circuitry that communicates with memory circuitry of the first memory IC die through controller circuitry of the controller die.

2. The memory stack of claim 1, wherein the bitlines are vertically skewed relative to the wordlines.

3. The memory stack of claim 1, wherein the first memory IC die is a different type of memory die than the second memory IC die.

4. The memory stack of claim 1 further comprising:
a first sub wordline driver disposed in the first memory IC die and coupled to the master wordline, the first sub wordline driver coupled by local wordlines to a first memory cell and a second memory cell of the first memory IC die; and
a second sub wordline driver disposed in the second memory IC die and coupled to the master wordline, the second sub wordline driver coupled by local wordlines to a first memory cell and a second memory cell of the second memory IC die.

5. The memory stack of claim 4, wherein the first memory IC die includes non-volatile memory circuitry.

6. The memory stack of claim 1, wherein the processor die is stacked below the controller die.

7. The memory stack of claim 1, wherein the first memory IC die includes NVM or ferro-electric random-access memory (FeRAM) circuitry.

8. The memory stack of claim 7, wherein the first memory IC die includes processor circuitry that communicates with the NVM or FeRAM circuitry through the controller circuitry.

9. The memory stack of claim 1, wherein the first memory IC includes a plurality of first memory mats, and wherein the second memory IC includes a plurality of second memory mats, each first memory mat of the first memory IC is coupled to a corresponding second memory mat of the second memory IC.

10. The memory stack of claim 1, wherein the wordlines of the second memory IC die are segmented.

11. The memory stack of claim 10, wherein two or more of the segmented wordlines of the second memory IC die are linearly aligned.

12. The memory stack of claim 10, wherein each of the segmented wordlines is coupled to a respective one of the bitlines.

13. The memory stack of claim 1, further comprising:
a buffer IC die disposed between the first memory IC die and the second memory IC die.

14. A memory stack comprising:
a first memory IC die;
a second memory IC die stacked on the first memory IC die, wherein bitlines are routed through the first and second memory IC dies in a substantially vertical orientation, and wherein wordlines within the first memory IC die are oriented orthogonal to the bitlines;
a third memory IC die stacked on the second memory IC die; and
error correction code (ECC) support circuitry disposed in at least two of the first, second and third memory IC dies.

15. A chip package comprising:
a substrate;
a memory stack mounted on the substrate, the memory stack comprising:
a first memory IC die; and
a second memory IC die stacked on the first memory IC die, wherein bitlines are routed through the first and second IC dies in a substantially vertical orientation, and wherein wordlines within the first memory IC die are oriented orthogonal to and skewed with the bitlines;
a master wordline coupled to at least one memory cell in each of the first memory IC die and the second memory IC die;
a controller die stacked in contact with the first memory IC die; and
a processor die stacked in contact with the controller die, the processor die includes processor circuitry that communicates with memory circuitry of the first memory IC die through controller circuitry of the controller die.

16. The chip package of claim 15, wherein the first memory IC die is a different type of memory die than the second memory IC die.

17. The chip package of claim 15, wherein the controller die is stacked below the first memory IC die, and the processor die is stacked below the controller die.

18. The chip package of claim 15, wherein the wherein the wordlines of the second memory IC die are segmented.

19. The chip package of claim 18, wherein two or more of the segmented wordlines of the second memory IC die are linearly aligned; and wherein each of the segmented wordlines is coupled to a respective one of the bitlines.

* * * * *